United States Patent [19]
Goto et al.

[11] Patent Number: 5,238,771
[45] Date of Patent: Aug. 24, 1993

[54] LITHOGRAPHIC PRINTING PLATE UTILIZING ALUMINUM SUBSTRATE WITH PHOTOSENSITIVE LAYER CONTAINING O-NAPHTHOQUINONEDIAZIDE SULFONIC ACID ESTER, ALKALI SOLUBLE RESIN AND SELECT ADDITIVE

[75] Inventors: Kiyoshi Goto; Hideyuki Nakai, both of Hino; Hiroshi Tomiyasu, Tama; Yoshiko Kobayashi, Nagoya, all of Japan

[73] Assignees: Konica Corporation; Mitsubishi Kasei Corporation, both of Tokyo, Japan

[21] Appl. No.: 963,001

[22] Filed: Oct. 19, 1992

Related U.S. Application Data

[63] Continuation of Ser. No. 655,043, Feb. 14, 1991, abandoned, which is a continuation of Ser. No. 358,232, May 30, 1989, abandoned.

[30] Foreign Application Priority Data

| May 31, 1988 | [JP] | Japan | 63-133508 |
| Jun. 13, 1988 | [JP] | Japan | 63-145476 |
| Jul. 20, 1988 | [JP] | Japan | 63-180624 |

[51] Int. Cl.$^5$ .......................... G03F 7/023; G03C 1/61
[52] U.S. Cl. ..................................... 430/165; 430/190; 430/191; 430/192; 430/193; 430/302
[58] Field of Search ............... 430/191, 192, 193, 165, 430/302, 190

[56] References Cited

U.S. PATENT DOCUMENTS

| 3,046,120 | 7/1962 | Schmidt et al. | 430/191 |
| 3,093,478 | 6/1963 | Peterson et al. | 430/152 |
| 3,635,709 | 1/1972 | Kobayashi | 430/191 |
| 3,868,254 | 2/1975 | Wemmers | 430/191 |
| 4,028,111 | 6/1977 | Iwasaki et al. | 430/191 |
| 4,123,279 | 10/1978 | Kobayashi | 430/192 |
| 4,139,384 | 2/1979 | Iwasaki et al. | 430/302 |
| 4,215,191 | 7/1980 | Kwok | 430/192 |
| 4,289,838 | 9/1981 | Rowe et al. | 430/163 |
| 5,182,183 | 1/1993 | Tomiyasu et al. | 430/165 |

FOREIGN PATENT DOCUMENTS

| 054258 | 6/1982 | European Pat. Off. |
| 0287212 | 10/1988 | European Pat. Off. |
| 61-167948 | 7/1986 | Japan |
| 62-57282 | 3/1987 | Japan |
| 62-95219 | 5/1987 | Japan |
| 62-111413 | 5/1987 | Japan |
| 63-304246 | 12/1988 | Japan |

*Primary Examiner*—Charles L. Bowers, Jr.
*Assistant Examiner*—Christopher G. Young
*Attorney, Agent, or Firm*—Finnegan, Henderson, Farabow, Garrett & Dunner

[57] ABSTRACT

There are disclosed a photosensitive composition which comprises:
(1) an o-naphtoquinonediazide compound;
(2) an alkali soluble resin; and
(3) any one selected from the groups consisting of:
 (a) an ester compound of a polyoxyalkylene sorbitol fatty acid and/or an ether compound of the fatty acid,
 (b) an alkylene oxide adduct of castor oil, hardened castor oil, lanolin alcohol, beeswax, phytosterol or phytostanol, and
 (c) at least one activator selected from the group consisting of polyoxypropylene alkyl ethers, polyoxypropylene alkylphenyl ethers and polyoxypropylene alkyl esters;.

and a photosensitive lithographic printing plate which comprises a support; and a photosensitive layer formed by applying the above photosensitive composition.

5 Claims, No Drawings

LITHOGRAPHIC PRINTING PLATE UTILIZING ALUMINUM SUBSTRATE WITH PHOTOSENSITIVE LAYER CONTAINING O-NAPHTHOQUINONEDIAZIDE SULFONIC ACID ESTER, ALKALI SOLUBLE RESIN AND SELECT ADDITIVE

This application is a continuation of application Ser. No. 07/655,043, filed Feb. 14, 1991, now abandoned, which is a continuation of application Ser. No. 07/358,232, filed May 30, 1989, now abandoned.

BACKGROUND OF THE INVENTION

This invention relates to a photosensitive composition and a photosensitive lithographic printing plate, more particularly to a photosensitive composition suitable for a positive-type photosensitive lithographic printing plate and a photosensitive lithographic printing plate by use thereof.

A positive-type lithographic printing plate has an ink-receiving photosensitive layer on a hydrophilic support, and an image exposure is effected on the photosensitive layer, followed by developing, thereby forming an image by removing the non-image portion while permitting the image portion to remain. In the case of practical printing, the lipophilic property of the image portion and the hydrophilic property of the non-image portion are utilized.

Ordinarily, in the photosensitive layer of the positive-type lithographic printing plate, an o-quinonediazide compound as the photosensitive component, and an alkali soluble resin as the component for enhancing the film strength and the alkali solubility are contained.

In carrying out the so-called multi-face printing in which a plurality of film originals are sequentially printed with varied positions on a photosensitive printing plate by use of such composition, it has been desired to shorten the printing time, namely sensitivity elevation, from the standpoint of working.

The photosensitive layer by use of an o-quinonediazide compound, when handled under white fluorescent lamp, suffers from light fogging, and when subjected subsequently to developing, the photosensitive layer at the image portion is invaded at the image portion to cause reduction of film, whereby the trouble of lowering in printing power has occurred frequently. For this reason, it has been desired to have a photosensitive lithographic printing plate having a photosensitive layer improved in resistance to light fogging by white fluorescent lamp (hereinafter called "safe light characteristic").

Further, developing processing of the photosensitive lithographic printing plate by use of an o-quinonediazide compound is performed generally in a developer of an aqueous alkali solution, but the developing ability of the developer is susceptible to fluctuation by various conditions, whereby the developing ability may be sometimes lowered by fatigue by treatment of a large amount or deterioration by air oxidation and the photosensitive layer at the non-image portion of the printing plate may not be completely dissolved even when processed. On the contrary, due to elevation of the bath temperature accompanied with excessive supplemented amount of the developer or elevation of the air temperature, the developing ability may sometimes become higher than that defined, whereby the image portion of the printing plate may be invaded or the dot may disappear. Particularly, when the image line portion at the portion where a worker has touched with a finger during multi-face printing working, etc., there has been involved the problem that it was invaded in the shape of a fingerprint.

Also, the dot reproducibility accompanied with fluctuation in the processing conditions such as various fluctuations of the developer, etc. as mentioned above has been a problem. The fluctuation in dot reproducibility is a crucial problem because it is revealed as fluctuation in gradation. Particularly, when reproducibility of small dot is inferior, the reproducibility at the high light portion in the printed product obtained has posed a problem.

Further, a positive-type photosensitive lithographic printing plate has also the drawbacks that it is weakly resistant to various processing chemicals used during printing, for example, isopropyl alcohol, UV ink, plate cleaner, etc. contained in wetting water, and consequently lowered in printing resistance.

For this reason, the photosensitive lithographic printing plate has been desired to have broad developing tolerance which exhibits developing characteristics similar to the standard developer even in a developer lowered in processing ability or a developer with the processing ability potentiated higher than the standard. (In the following, the tolerable range of lowered developing ability to give adequate developing result is called underdevelopability, and the tolerable range of elevated developing ability to give adequate developing result is called overdevelopability).

As a means for solving the above problems, for example, Japanese Provisional Patent Publication No. 121044/1984 discloses addition of an amphoteric surfactant and an organic boron type surfactant for improvement of sensitivity and developing tolerance, but it had no effect in improvement of the above problem.

Further, Japanese Provisional Patent Publication No. 251740/1987 and U.S. Pat. No. 3,868,254 disclose improvement of developing tolerance by addition of a nonionic surfactant, but it was still insufficient concerning sensitivity and safe light characteristic. Also, it had the drawback that foaming of the developer occurred when performing developing processing.

Accordingly, it has been desired to have a photosensitive composition suitable for photosensitive lithographic printing plate having good sensitivity and further little foaming of the developer without damaging safe light characteristic, developing tolerance, and a photosensitive lithographic printing plate.

SUMMARY OF THE INVENTION

An object of the present invention is to provide a photosensitive lithographic printing plate improved in developing tolerance and safe light characteristic without lowering in sensitivity and underdevelopability.

Another object of the present invention is to provide a photosensitive lithographic printing plate excellent in all of resistance to invasion of the image line portion at the fingerprint trace and chemical resistance, safe light characteristic and small dot reproducibility in developing having developing power as defined or higher and a photosensitive composition suitable for said printing plate.

The present inventors have investigated variously in view of the problems of the prior art as mentioned above, and consequently found that an excellent photosensitive composition and a photosensitive lithographic printing plate having solved the above problems can be obtained by use of a specific compound in combination, to accomplish the present invention.

More specifically, the gist of the present invention resides in a photosensitive composition comprising:
(1) an o-naphtoquinonediazide compound;
(2) an alkali soluble resin; and
(3) any one activator selected from the groups consisting of:
 (a) an ester compound of a polyoxyalkylene sorbitol fatty acid and/or an ether compound of a polyoxyalkylene sorbitol,
 (b) an alkylene oxide adduct of castor oil, hardened castor oil, lanolin, lanolin alcohol, beeswax, phytosterol or phytostanol, and
 (c) at least one activator selected from the group consisting of polyoxypropylene alkyl ethers, polyoxypropylene alkylphenyl ethers and polyoxypropylene alkyl esters,
and a lithographic printing plate having a support and a photosensitive layer comprising the above photosensitive composition

DESCRIPTION OF THE PREFERRED EMBODIMENTS

The o-napthoquinonediazide compound in the present invention is not particularly limited, provided that it includes the structure of o-naphthoquinonediazide and is a compound satisfying the spirit of the present invention, and may include, for example, ester compounds of o-naphthoquinonediazide sulfonic acids and polycondensed resins of phenols which may be substituted by a methyl group(s) with an aldehyde or a ketone.

Examples of phenols may include monovalent phenols such as phenol, o-cresol, m-cresol, p-cresol, 3,5-xylenol, carvacrol, thymol, divalent phenols such as catechol, resorcin, hydroquinone, etc., trivalent phenols such as pyrogallol, phloroglucin, etc. As the above aldehyde, there may be included formaldehyde, benzaldehyde, acetaldehyde, crotonaldehyde, furfural, etc. Among them, preferred are formaldehyde and benzaldehyde. As the above ketone, acetone, methyl ethyl ketone may be employed.

Specific examples of the above polycondensed resin may include phenol-formaldehyde resin, m-cresol-formaldehyde resin, m- and p-mixed cresol-formaldehyde resin, resorcinbenzaldehyde resin, pyrogallol-acetone resin, etc. The weight average molecular weight Mw of the polycondensed resin may be preferably within the range from $5.0 \times 10^2$ to $5.0 \times 10^3$, more preferably from $8.0 \times 10^2$ to $3.0 \times 10^3$.

The condensation degree of o-naphthoquinonediazide sulfonic acid relative to OH groups of the phenols in the above o-naphthoquinonediazide compound (reaction ratio to one OH group) may be preferably 15 to 80%, more preferably 20 to 45%.

Further, as the o-naphthoquinonediazide compound to be used in the present invention, not only resins but also the following compounds as described in Japanese Provisional Patent Publication No. 4345/1983 can be also used. More specifically, there can be exemplified those described in J. Kosar, "Light-Sensitive Systems", pp. 339-352, 1965, John Wiley & Sons, New York and W. S. Forest, "Photoresist", vol. 50, 1975, McGraw-Hill, New York, namely, 1,2-quinonediazide compounds such as 1,2-naphthoquinonediazide-5-sulfonic acid cyclohexyl ester, 1-(1,2-naphthoquinonediazide-5-sulfonyl)-3,5-dimethylpyrazole, 1,2-naphthoquinonediazide-5-sulfonic acid-4″-hydroxydiphenyl-4″-azo-β-naphthol ester, N,N-di-(1,2-naphthoquinonediazide-5-sulfonyl)-aniline, 2′-(1,2-naphthoauinonediazide-5-sulfonyloxy)-1-hydroxyanthraquinone, 1,2-naphthoquinonediazide-5-sulfonic acid-2,4-dihydroxybenzo-phenone ester, 1,2-naphthoquinonediazide-5-sulfonic acid-2,3,4-trihydroxybenzophenone ester, condensate of 2 moles of 1,2-naphthoquinonediazide-5-sulfonic acid chloride and 1 mole of 4,4′-diaminobenzophenone, condensate of 2 moles of 1,2-naphthoquinonediazide-5-sulfonic acid chloride and 1 mole of 4,4′-dihydroxy-1,1′-diphenylsulfone, condensate of 1 mole of 1,2-naphthoqui-nonediazide-5-sulfonic acid chloride and 1 mole of purpuro-gallin, 1,2-naphthoquinone-diazide-5-(N-dihydroapiethyl)-sufonamide and other 1,2-quinone diazide compounds. Also, there may be included 1,2-naphthoquinonediazide compounds disclosed in Japanese Patent Publications Nos. 1953/1962, 3627/1962, 13109/1962, 26126/1965, 3801/1965, 5604/1970, 27345/1970, 13013/1976, Japanese Provisional Patent Publications Nos. 96575/1983, 63802/1983 and 63803/1983.

As the o-naphthoquinonediazide compound of the present invention, the above compounds may be used either individually or as a combination of two or more kinds.

The proportion of the o-naphthoquinonediazide compound to be used in the present invention in the photosensitive composition may be preferably 5 to 60% by weight, particularly preferably 10 to 50% by weight.

The alkali soluble resin in the present invention may be any of the resins which can be used primarily as the binder, but novolac resins, vinyl polymer resins and combinations thereof can be included as preferred examples.

Examples of novolac resins may include phenol-formaldehyde resins, cresol-formaldehyde resin, phenol-cresol-formaldehyde copolycondensate resins as described in Japanese Provisional Patent Publication No. 57841/1980, copolycondensate resins of p-substituted phenol and phenol or cresol and formaldehyde as described in Japanese Provisional Patent Publication No. 127553/1980, etc.

The molecular weight of the above novolac resins may be preferably a number average molecular weight (hereinafter abbreviated as "Mn") of $3.00 \times 10^2$ to $7.50 \times 10^3$ and a weight average molecular weight (hereinafter abbreviated as "Mw") of $1.00 \times 10^3$ to $3.00 \times 10^4$, more preferably a Mn of $5.00 \times 10^2$ to $4.00 \times 10^3$ and a Mw of $3.00 \times 10^3$ to $2.00 \times 10^4$. Measurement of the molecular weight was performed according to the methods as described in Synthesis example 1 in the Examples shown below for both Mn and Mw.

The above novolac resin may be used either alone or as a combination of two or more kinds.

As the above vinyl polymer resin, polymers having units having phenolic hydroxyl group in the molecular structure are preferred, including the polymers containing at least one structural unit of the formulae (A) to (D) shown below:

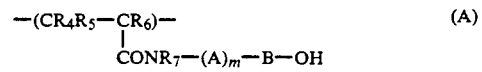
(A)

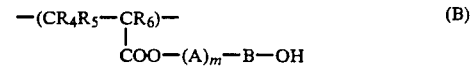
(B)

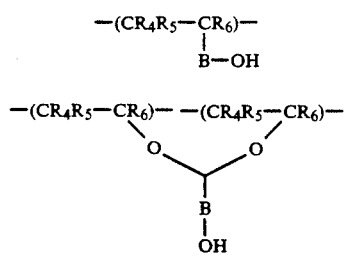

In the formulae, $R_4$ and $R_5$ each represent a hydrogen atom, an alkyl group or carboxyl group, preferably a hydrogen atom. $R_6$ represents a hydrogen atom, a halogen atom or an alkyl group, preferably a hydrogen atom or an alkyl group such as a methyl group, an ethyl group, etc. $R_7$ represents a hydrogen atom, an alkyl group, an aryl group or an aralkyl group, preferably an aryl group. A represents an alkylene group which may have a substituent for connecting a nitrogen atom or an oxygen atom to an aromatic carbon atom, m represents an integer of 0 to 10, and B represents a phenylene group which may also have substituent or a naphthylene group which may also have substituent.

As the polymer in the present invention, those having the copolymer type structure are preferred, and examples of the monomer unit which can be used in combination with the structural units represented respectively by the above formulae (A) to (D) may include ethylenic unsaturated olefins such as ethylene, propylene, isobutylene, butadiene, isoprene and the like; styrenes such as styrene, α-methylstyrene, p-methylstyrene, p-chlorostyrene and the like; acrylic acids such as acrylic acid, methacrylic acid and the like; unsaturated aliphatic dicarboxylic acids such as itaconic acid, maleic acid, maleic anhydride and the like; esters of α-methylene alihatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate, ethyl methacrylate and the like; nitriles such as acrylonitrile, methacrylonitrile and the like; amides such as acrylamide and the like; anilides such as acrylanilide, p-chloroacryl-anilide, m-nitroacrylanilide, m-methoxyacrylyanilide and the like; vinyl esters such as vinyl acetate, vinyl propionate, vinyl benzoate, vinyl butyrate and the like; vinyl ethers such as methyl vinyl ether, ethyl vinyl ether, isobutyl vinyl ether, β-chloroethyl vinyl ether and the like; vinyl chloride; vinylidene chloride; vinylidene cyanide; ethylene derivatives such as 1-methyl-1-methoxy-ethylene, 1,1-dimethoxyethylene, 1,2-dimethoxyethylene, 1,1-dimethoxycarbonylethylene, 1-methyl-1-nitroethylene and the like; N-vinyl compounds such as N-vinylpyrrole, N-vinylcarbazole, N-vinylindole, N-vinylpyrrolidene, N-vinylpyrrolidone and the like; and other vinyl monomers. These vinyl monomers exist in the polymeric compound with the structure of the unsaturated double bonds being split open therein.

Of the above monomers, esters of aliphatic monocarboxylic acids, nitriles exhibit excellent performances for the object of the present invention and therefore preferred.

In the following, representative specific examples of the vinyl polymers in the present invention are shown.

In the compounds shown below, s, k, l, m and n indicate mole % of the respective structural units.

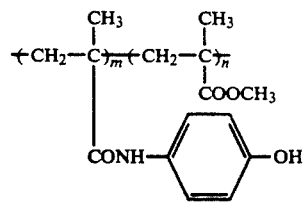

(Mw = 28000, Mw/Mn = 7.8, m:n = 40:60)

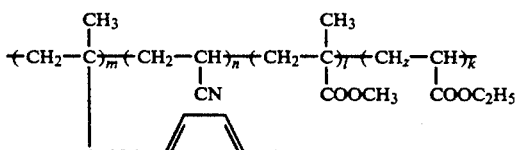

(Mw = 20000, Mw/Mn = 2.1, m:n:l:k = 30:30:36.5:3.5)

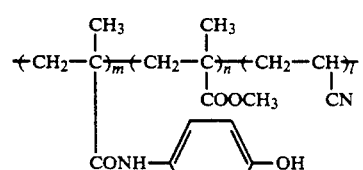

(Mw = 22000, Mw/Mn = 6.9, m:n:l = 30:40:30)

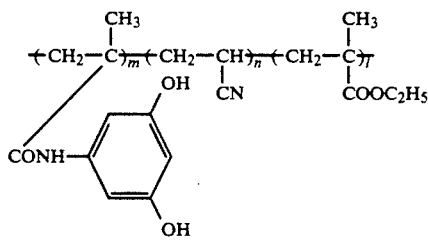

(Mw = 33000, Mw/Mn = 3.1, m:n:l = 20:35:45)

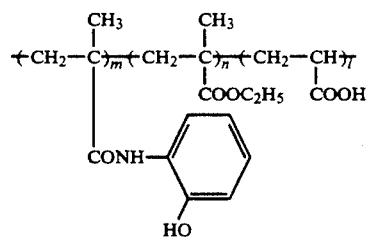

(Mw = 33000, Mw/Mn = 7, m:n:l = 38:60:2)

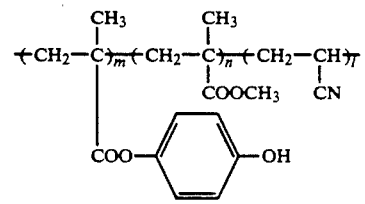

(Mw = 40000, Mw/Mn = 3.5, m:n:l = 20:60:20)

-continued

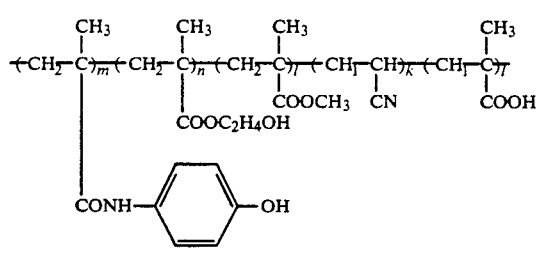

(Mw = 35000, Mw/Mn = 7.9,
m:n:l:k:$\beta$ = 20:15:30:33:2)

(g)

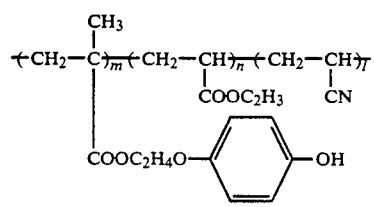

(Mw = 35000, Mw/Mn = 3.5,
m:n:l = 30:30:40)

(h)

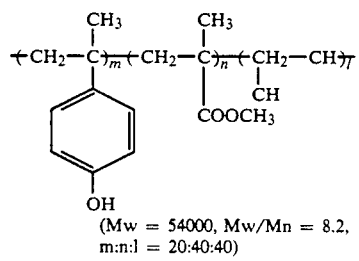

(Mw = 54000, Mw/Mn = 8.2,
m:n:l = 20:40:40)

(i)

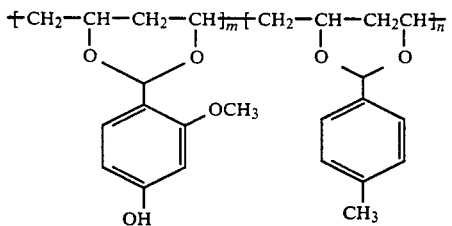

(Mw = 20000, Mw/Mn = 3.5,
m:n = 1:1)

(j)

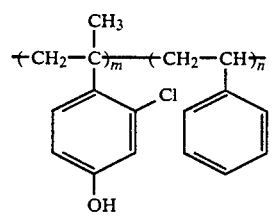

(Mw = 51000, Mw/Mn = 5.7,
m:n = 1:1)

(k)

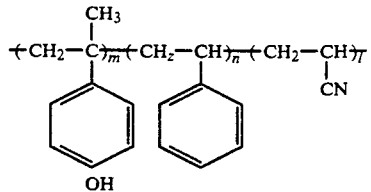

(Mw = 35000, Mw/Mn = 3.8,
m:n:l = 30:35:35)

(l)

The vinyl polymer to be used in the present invention as mentioned above may be used either alone or in combination of two or more kinds. Also, it can be used with other polymeric compounds, etc.

The novolac resin and the vinyl polymer to be used in the present invention may be used either alone or in combination. The proportion of the alkali soluble resin in the photosensitive composition may be suitably 5 to 95% by weight, preferably 20 to 90% by weight.

As the polyoxyalkylene sorbitol fatty acid ester compound or ether compound on a polyoxyalkylene sorbitol of 3 (a) to be used in the present invention (hereinafter called as "the present activator"), there may be included polyoxyethylene sorbitol fatty acid ester compounds or ether compounds of a polyoxyethylene sorbitol, polyoxypropylene sorbitol fatty acid ester compounds or ether compounds of a polyoxyethylene sorbitol, polyoxyethylenepolyoxypropylene sorbitol fatty acid ester compounds or ether compounds of a polyoxyethylene, etc.

Specific examples may include polyoxyethylene sorbitol hexastearate, polyoxyethylene sorbitol tetrastearate, polyoxyethylene sorbitol tetraoleate, polyoxyethylene sorbitol hexaoleate, polyoxyethylene sorbitol monooleate, polyoxyethylene sorbitol monolaurate, polyoxyethylene sorbitol tetralaurate, polyoxyethylene sorbitol hexalaurate, polyoxypropylene sorbitol hexastearate, polyoxypropylene sorbitol tetraoleate, polyoxypropylene sorbitol hexaoleate, polyoxypropylene sorbitol monolaurate, polyoxyethylenepolyoxypropylene sorbitol hexastearate, polyoxyethylenepolyoxypropylene sorbitol tetrastearate, polyoxyethylenepolyoxypropylene sorbitol monooleate, polyoxyethylenepolyoxypropylene sorbitol tetraoleate, polyoxyethylene sorbitol hexastearyl ether, polyoxyethylene sorbitol tetrastearyl ether, polyoxyethylene sorbitol tetra-oleyl ether, polyoxyethylene sorbitol monolauryl ether, polyoxyethylene sorbitol monooleyl ether and so on. The repeating number of the polyoxyalkylene chains per one molecule in the above activator of the present invention may be preferably 5 to 200, more preferably 10 to 100. As preferred polyoxyalkylene group, polyoxyethylene group may be mentioned.

The above compound of the present invention may be preferably in the photosensitive layer in an amount of 0.2 to 20% by weight, more preferably 0.5 to 10% by weight.

The above compound of the present invention may be used either alone, or as a combination of two or more kinds of ester compounds or as a combination of each one kind or more of ester compounds and ether compounds. As the alkylene oxide adduct of castor oil, hardened castor oil, lanolin, lanolin alcohol, beeswax, phytosterol or phytostanol of 3 (b) to be used in the present invention (hereinafter called "activator of the present invention"), a polyoxyethylene adduct may be preferably used. As such polyoxyethylene adduct, for example, the following compounds may be included (in the following, PEO represents polyoxyethylene, and the numerals in the brackets repre-sent the repeating unit number of oxyethylene group).

(1) Polyoxyethylene castor oil

Nikkol CO-3
 POE (3) castor oil
Nikkol CO-10
 POE (10) castor oil
Nikkol CO-20TX
 POE (20) castor oil
Nikkol CO-40TX
 POE (40) castor oil
Nikkol CO-50TX
 POE (50) castor oil
Nikkol CO-60TX
 POE (60) castor oil (2) Polyoxyethylene hardened castor oil Nikkol HCO-5
 POE (5) hardened castor oil
Nikkol HCO-7.5
 POE (7.5) hardened castor oil
Nikkol HCO-10
 POE (10) hardened castor oil
Nikkol HCO-20
 POE (20) hardened castor oil
Nikkol HCO-30
 POE (30) hardened castor oil
Nikkol HCO-40
 POE (40) hardened castor oil
Nikkol HCO-50
 POE (50) hardened castor oil
Nikkol HCO-60
 POE (60) hardened castor oil
Nikkol HCO-80
 POE (80) hardened castor oil
Nikkol HCO-100
 POE (100) hardened castor oil
Nikkol HCO-40 (for pharmaceutical)
 POE (40) hardened castor oil
Nikkol HCO-50 (for pharmaceutical)
 POE (50) hardened castor oil
Nikkol HCO-60 (for pharmaceutical)
 POE (60) hardened castor oil (3) Polyoxyethylene phytosterol Nikkol BPS-5
 POE (5) phytosterol
Nikkol BPS-10
 POE (10) phytosterol
Nikkol BPS-20
 POE (20) phytosterol
Nikkol BPS-30
 POE (30) phytosterol (4) Polyoxyethylene phytostanol Nikkol BPSH-25
 POE (25) phytostanol (5) Polyoxyethylene lanolin Nikkol TW-10
 POE lanolin
Nikkol TW-20
 POE lanolin
Nikkol TW-30
 POE lanolin (6) Polyoxyethylene lanolin alcohol Nikkol BWA-5
 POE (5) lanolin alcohol
Nikkol BWA-10
 POE (10) lanolin alcohol
Nikkol BWA-20
 POE (20) lanolin alcohol
Nikkol BWA-40
 POE (40) lanolin alcohol (7) Polyoxyethylene beeswax derivative Nikkol GBW-25
 POE (6) sorbitol beeswax
Nikkol GBW-125
 POE (20) sorbitol beeswax
(all produced by Nikko Chemicals)

The repeating number of oxyethylene groups in the above polyethylene adduct may be preferably 5 to 200, more preferably 10 to 100.

The proportion of the above activator of the present invention in the photosensitive layer may be preferably 0.2 to 20% by weight, more preferably 0.5 to 10% by weight.

Next, the activator of 3 (c) to be used in the present invention is at least one selected from the group consisting of polyoxypropylene alkyl ethers, polyoxypropylene alkylphenyl ethers and polyoxypropylene alkyl esters, and specifically, for example, the compounds shown below are preferred.

That is, there may be included as polyoxypropylene alkyl ethers, polyoxypropylene lauryl ether, polyoxypropylene cetyl ether, polyoxypropylene stearyl ether, polyoxypropylene oleyl ether and the like; and as polyoxypropylene alkylphenyl ethers, polyoxypropylene octylphenyl ether, polyoxypropylene nonylphenyl ether, polyoxypropylene oleylphenyl ether, polyoxypropylene octylphenyl ether, polyoxypropylene nonylphenyl ether and the like; and as polyoxypropylene alkyl esters, polyoxypropylene lauryl ester, polyoxypropylene cetyl ester, polyoxypropylene stearyl ester and the like.

Also, polyethylene glycol, polyoxyethylene alkyl ether, polyoxyethylene alkyl phenyl ether, polyoxyethylene alkyl ester, etc. may be used.

The above activator may be used either alone or as a combination of two or more kinds, and its proportion in the photosensitive composition may be preferably 0.05 to 10% by weight based on the total composition, more preferably selected from the range of 0.1 to 5% by weight.

The photosensitive composition is obtained from the components as described above, and in supplying said composition to a positive-type photosensitive lithographic printing plate, otherwise, organic acid, lipid formation sensitive agent, exposure visible picture imparting agent and dye are generally added.

As the organic acid, those having pKa value of 2 or higher, preferably pKa value of 3 or higher may be employed. In the case of an organic acid with pH value less than 2, there is a tendency that dye remains and chemical resistance is lowered. The pKa value in the present invention is a value at 25° C.

Such organic acid is not particularly limited, provided that the pKa value satisfies the above condition, and monocarboxylic acids and dicarboxylic acids may be included. Examples of monocarboxylic acids may include aliphatic monocarboxylic acids such as formic acid, acetic acid, propionic acid, butyric acid, isobutyric acid, pentanoic acid, hexanoic acid, heptanoic acid, erucic acid, oleic acid, etc.; alicyclic monocarboxylic acids such as cyclo-hexanoic carboxylic acid, etc; aromatic monocarboxylic acids such as o-, m- and p-aminobenzoic acid, o-, m- and p-hydroxybenzoic acid, o-, m- and p-methoxybenzoic acid, o-, m- and p-methylbenzoic acid, 3,5-dihydroxybenzoic acid, phloroglucin, carboxylic acid, gallic acid, 3,5-dimethyl-benzoic acid, etc.

Examples of dicarboxylic acids may include saturated or unsaturated aliphatic dicarboxylic acids such as malonic acid, methylmalonic acid, dimethylmalonic acid, succinic acid, glutaric acid, adipic acid, pimellic acid, suberic acid, azelaic acid, sebacic acid, itaconic acid, malic acid, etc.; alicyclic dicarboxylic acids such as tetrahydrophthalic acid, 1,1-cyclobutane dicarboxylic acid, 1,1-cyclopentane dicarboxylic acid, 1,3-cyclopentane dicarboxylic acid, 1,1-cyclohexane dicarboxylic acid, 1,2-cyclohexane dicarboxylic acid, 1,3-cyclohexane dicarboxylic acid, etc.; aromatic dicarboxylic acids such as phthalic acid, isophthalic acid, terephthalic acid, etc.

The proportion of the above organic acid in the photosensitive composition may be generally suitably 0.05 to 15% by weight, preferably 0.1 to 8% by weight.

As the lipid formation sensitive agent, generally a resin comprising a condensate of a substituted phenol represented by the formula (I) shown below and an aldehyde and/or o-naphthoquinonediazide sulfonic acid ester compound of said resin may be used.

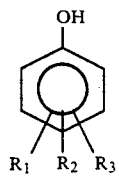

(I)

(wherein $R_1$ and $R_2$ each represent a hydrogen atom, an alkyl group or a halogen atom, and $R_3$ represents an alkyl group having 2 or more carbon atoms or a cycloalkyl group).

In the above formula (I), $R_1$ and $R_2$ each represent a hydrogen atom, an alkyl group (inclusive of those having 1 to 3 carbon atoms; an alkyl group having 1 or 2 carbon atoms is particularly useful) or a halogen atom (of fluorine, chlorine, bromine and iodine, particularly chlorine and bromine are preferred), and $R_3$ represents an alkyl group having 2 or more carbon atoms (preferably not more than 15 carbon atoms, and an alkyl group having 3 to 8 carbon atoms is particularly useful) or a cycloalkyl group (inclusive of those having 3 to 15 carbon atoms; particularly a cycloalkyl group having 3 to 8 carbon atoms is useful).

Examples of the above substituted phenols may include isopropylphenol, tert-butylphenol, tert-amylphenol, hexylphenol, tert-octylphenol, cyclohexylphenol, 3-methyl-4-chloro-5-tert-butylphenol, isopropylcresol, tert-butylcresol, tert-amylcresol, hexylcresol, tert-octylcresol, cyclohexylcresol and the like. Among them, tert-octylphenol and tert-butylphenol are particularly preferred.

The above aldehydes can form resins through condensation with substituted phenols, and may include aliphatic and aromatic aldehydes having 1 to 6 carbon atoms such as formaldehyde, benzaldehyde, acetaldehyde, acrolein, crotonaldehyde, furfural, etc. Among them, formaldehyde and benzaldehyde are preferred.

The resin comprising a condensate of a substituted phenol and an aldehyde can be synthesized generally by polycondensation of a substituted phenol represented by the formula (I) and an aldehyde in the presence of an acidic catalyst. Useful acidic catalysts may include inorganic acids or organic acids such as hydrochloric acid, oxalic acid, sulfuric acid, phosphoric acid, etc., and the formulation ratio of the substituted phenol to the aldehyde may be 0.7 to 1.0 mole of the aldehyde to 1 mole of the substituted phenol. As the reaction solvent, alcohols, acetone, water, tetrahydrofuran, etc. may be employed, and after the reaction at a predetermined temperature ($-5°$ to $120°$ C.) for a predetermined period of time (3 to 48 hours), the product is obtained by heating under reduced pressure, washing with water followed by dehydration, or alternatively the condensed resin is obtained by reprecipitation by water.

In the present invention, the condensed resin is used as such or as an o-naphthoquinonediazide sulfonic acid ester compound of the resin.

Said ester compound can be obtained by esterification by dissolving the above condensed resin in an appropriate solvent, for example, dioxane, etc., adding o-naphthoquinonediazide sulfonic acid chloride thereto, and adding an alkali such as alkali carbonate dropwise under heating and stirring into the mixture to the equivalent point.

In the above esterified compound, the condensation ratio of o-naphthoquinodiazide sulfonic acid chloride to the hydroxyl groups of the phenol (reaction ratio % to one hydroxyl group) may be preferably 5 to 80%, more preferably 20 to 70% further preferably 30 to 60%. Said condensation ratio is a value obtained by determining the content of sulfur atom of sulfonyl group by elemental analysis.

The amount of the lipid formation sensitive agent in the photosensitive composition of the present invention may be preferably 0.05 to 15% by weight, particularly preferably 1 to 10% by weight.

The lipid formation sensitive agent of the present invention has a Mw preferably in the range from $5.0 \times 10^2$ to $5.0 \times 10^3$, more preferably $7.0 \times 10^2$ to $3.0 \times 10^3$. Its Mn may be preferably in the range from $3.0 \times 10^2$ to $2.5 \times 10^3$, more preferably from $4.0 \times 10^2$ to $2.0 \times 10^3$.

As the exposure visible image imparting agent, a compound generating an acid by exposure, and as the dye a compound forming a salt with this acid may be generally employed.

As the compound generating an acid by exposure, a trihaloalkyl compound or a diazonium salt compound represented by the formula (II) or (III) shown below may be preferably employed:

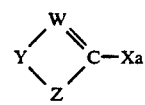

(II)

(Xa represents a trihaloalkyl group having 1 to 3 carbon atoms, W represent N, S, Se or P, Z represents O, N, S, Se or P, and Y represents a group having a chromogenic group and a group of non-metallic atoms necessary for cyclization of W and Z).

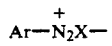 (III)

(Ar represents an aryl group and X represents an ion pair of an inorganic compound).

Specifically, for example, as the trihaloalkyl compound of the formula (II), the compounds represented by the following formulae (IV), (V) and (VI) may be included.

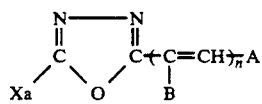 (IV)

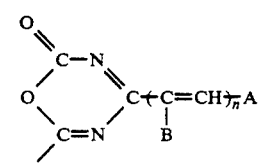 (V)

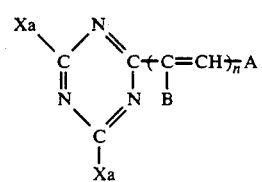 (VI)

(wherein Xa represents a trihaloalkyl group having 1 to 3 carbon atoms, B represents hydrogen or methyl group, A represents substituted or unsubstituted aryl group or heterocyclic group, and n is 0, 1 or 2).

Specific exemplary compounds may include oxadiazole compounds having a benzofuran ring as the formula (IV) such as:

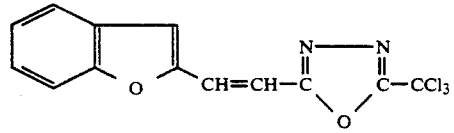 (1)

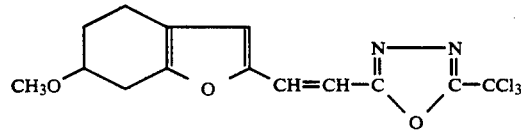 (2)

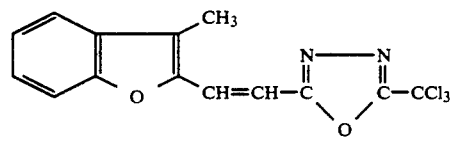 (3)

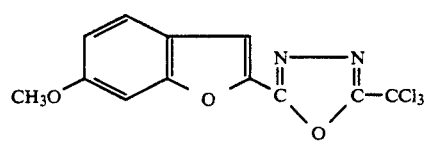 (4)

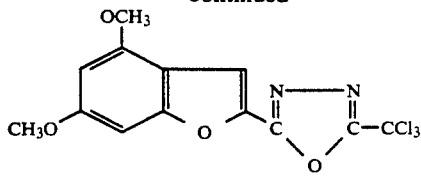 (5)

2-trichloromethyl-5-(p-methoxystyryl)-1,3,4-oxadiazole compounds, etc. disclosed in Japanese Provisional Patent Publication No. 74728/1979.

As the compounds of the formulae (V) and (VI), there may be included 4-(2,4-dimethoxy-4-styryl)-6-trichloromethyl-2-pyrrone compounds, 2,4-bis-(trichloromethyl)-6-p-methoxystyryl-s-triazine compounds, 2,4-bis-(trichloromethyl)-6-p-dimethylaminostyryl-s-triazine compounds disclosed in Japanese Provisional Patent Publication No. 36223/1978.

As the above diazonium salt compound, a diazonium salt generating strong Lewis acid by exposure is preferred, and an ion pair of an inorganic compound may be recommended as the ion pair portion. Specific examples may include aromatic diazonium salt wherein the anion portion of diazonium salt which is at least one of phosphorus fluoride ion, arsenic fluoride ion, antimony fluoride ion, antimony chloride ion, tin chloride ion, bismuth chloride ion and zinc chloride ion, preferably p-diazophenylamine salt.

The proportion of the above exposure visible image imparting agent in the total photosensitive composition may be preferably 0.01 to 20% by weight, further preferably 0.1 to 20% by weight, particularly 0.2 to 10% by weight.

On the other hand, as the above dye, any compound capable of forming a salt with an acid generally known may be available, including triphenylmethane type dyes, cyanine dyes, diazo dyes, styryl dyes. More specifically, there may be included Victoria Pure Blue 80, Ethyl Violet, Crystal Violet, Brilliant Green, Basic Fucsine, Eosine, Phenol-phthalein, Xylenol Blue, Congo Red, Malachite Green, Oil Blue #603, Oil Pink #312, Cresol Red, Auramine, 4-p-diethylaminophenyliminonaphthoquinone, Leuco Malachite Green, Leuco Crystal Violet, etc. The amount of the dye added may be preferably about 0.01 to 10% by weight, more preferably 0.05 to 8% by weight.

The above photosensitive composition is formed by applying a coating material dissolved in various coating solvents, for example, cellosolves such as methyl (ethyl) cellosolve, methyl (ethyl) cellosolve acetate, etc., dimethylformamide, dimethyl sulfoxide, dioxane, acetone, cyclohexanone, trichloroethylene, etc. on a support of aluminum which has been sand blasted and subjected to the anodic oxidation as described below, followed by drying.

In using the positive-type photosensitive lithographic printing plate thus obtained, a known method may be applicable, and exposure is effected by ultra-high pressure mercury lamp, metal halide lamp, etc. with a positive-type film contacted thereon, and the plate is developed with an alkali aqueous solution such as of sodium metasilicate, potassium metasilicate, sodium phosphate, sodium hydroxide, etc., and supplied as the printing plate. If necessary, burning treatment is also applied. The lithographic printing plate thus prepared is then used in a printer for sheet, off-ring.

The coating method applicable to production of the photosensitive lithographic printing plate of the present invention may include, for example, rotary coating, wire bar coating, dip coating, air knife coating, roll coating, blade coating and curtain coating. The coating amount may differ depending on the use, but preferably 0.5 to 5.0 g/m$^2$ as solid components.

As a support to be used in the photosensitive lithographic printing plate, metal plates of aluminum, zinc, steel, copper, etc., as well as metal plates, paper, plastic film and glass plate, having chromium, zinc, copper, nickel, aluminum, iron, etc. plated or vapor deposited thereon, paper coated with a resin, paper plastered with a metal foil of aluminum, etc., plastic film subjected to hydrophilic treatment, etc. may be included. Among them, aluminum plate is preferred, and the support on which the photosensitive composition as described above is to be provided is limited to aluminum plate. As the support for the photosensitive lithographic printing plate of the present invention, it is preferable to use an aluminum plate applied with sand blasting treatment, anodic oxidation treatment and, if necessary, surface treatment such as sealing treatment, etc.

For these treatments, known methods may be applicable.

As the sand blasting treatment method, for example, the mechanical method, the method of effecting etching by electrolysis may be employed. As the mechanical method, there may be included the ball polishing method, the brush polishing method, the polishing method according to liquid horning, the buff polishing method, etc. Depending on the composition of the aluminum material, various methods as mentioned above can be used either alone or in combination. Preferably, the electrolytic etching method may be employed.

Electrolytic etching may be performed in a bath containing inorganic acids such as phosphoric acid, sulfuric acid, hydrochloric acid, nitric acid, etc. either alone or as a mixture of two or more kinds. After the sand blasting treatment, if necessary, desmatting treatment is carried out with an aqueous solution of an alkali or an acid, followed by neutralization and washing with water.

The anodic oxidation treatment is effected by use of a solution containing one or more of sulfuric acid, chromic acid, oxalic acid, phosphoric acid, malonic acid, etc. as the electrolyte, and an aluminum plate as the anode. The amount of the anodically oxidized film may be suitably 1 to 50 mg/dm$^2$, preferably 10 to 40 mg/dm$^2$. The amount of the anodically oxidized film can be determined by dipping the aluminum plate in a chromic acid-phosphoric acid solution (prepared by dissolving 35 ml of 85% phosphoric acid solution and 20 g of chromic oxide (VI) in one liter of water) to dissolve the oxide film and measuring the change in weight before and after dissolution of the film of the aluminum plate.

The sealing treatment may include the boiling water treatment, the water vapor treatment, the sodium silicate treatment, the aqueous bichromate solution treatment, etc. as specific examples. Otherwise, it is also possible to apply to the support of the aluminum plate a subbing treatment with an aqueous solution of a water-soluble polymeric compound or a metal salt of zirconium fluoride, etc.

Generally speaking, a photosensitive lithographic printing plate is subjected to exposure printing by use of an exposure printing device, and then developed with a developer. As the result, only the unexposed portion remains on the surface of the support to form a positive-positive type relief image.

As the developer to be used for development of the photosensitive lithographic printing plate in the present invention, an aqueous alkali developer is preferred. As the above aqueous alkali developer, for example, aqueous solutions of alkali metal salts such as sodium hydroxide, potassium hydroxide, sodium carbonate, potassium carbonate, sodium metasilicate, potassium metasilicate, sodium secondary phosphate, sodium tertiary phosphate, etc. may be included.

EXAMPLES

The present invention is described in detail below by referring to Examples of the photosensitive lithographic printing plate of the present invention, but the present invention is not limited at all to these Examples.

Synthesis of Photosensitive Material

Synthesis Example 1 (Synthesis of QD-2)

After 50 g of pyrogallol and 350 g of acetone were charged into a three-necked flask set in a water bath, nitrogen gas was blown thereinto to effect nitrogen replacement and then 5 g of phosphorus oxychloride was charged to carry out the polycondensation reaction. The reaction temperature was maintained at 20° C., and after the reaction overnight, the mixture was gradually thrown into 15 liters of water under vigorous stirring to precipitate the polycondensate formed.

The precipitated resin was recovered by filtration, washed with water to neutral with pH of about 7, and the filtered product was dried at 40° C. or lower. Thus, 50 g of a pale brown resin was obtained.

The molecular weight of the resin was measured by gel permeation chromatography [Hitachi 635 Model, column: series of Shodex A804, A803 and A302] with polystyrene as the standard. Mn and Mw were calculated according to the method in which the peaks in the oligomer region are averaged (the centers between the mountain and the valley of peaks are connected) as described in Tsuge et al, Journal of Chemical Society of Japan, April, 1972, p. 800). As the result, Mn was $2.00 \times 10^3$ and Mw was $3.40 \times 10^3$.

Next, 60 g of the resin was dissolved in 720 ml of dioxane, 70 g of 1,2-naphthoquinonediazide-5-sulfonyl chloride was charged into the solution to be dissolved therein, and then 60 g of an aqueous potassium carbonate (13% by weight) solution was added dropwise. After the condensation reaction was carried out at 40° to 50° C. for about 1 hour, the reaction mixture was thrown into a large amount of dil. hydrochloric acid (conc. hydrochloric acid 13 ml, water 3 liters), and the precipitated resin was recovered by filtration and dried to give 56 g of yellow powdery resin of 1,2-naphthoquinonediazide-5-sulfonate of pyrogallol-acetone resin. As the result of analysis, the condensation degree of OH groups was 20%. When the molecular weight of the ester derivative was measured similarly as the polyhydroxy resin, Mn was $2.30 \times 10^3$ and Mw was $3.03 \times 10^3$.

Synthesis of Binder

Synthesis Example 2 (Corresponding to the Above (b))

A mixture of 400 g of p-hydroxyaniline, 4 g of hydroquinone monomethyl ether, 4 liters of acetone and 360 g of pyridine was cooled externally with the use of a coolant, and when the inner temperature was lowered to −10° C., 420 g of methacrylic acid chloride was added dropwise under stirring. The dropwise addition temperature was controlled so that the reaction temperature became 0° C. or lower, and after completion of the dropwise addition, the mixture was stirred at 0° to 3° C. for about 2 hours, and then at 25° C. for 2 hours. Then, the reaction mixture was concentrated to about ⅓, and the concentrate was poured into 10 liters of dil. hydrochloric acid (pH about 1.0), and the precipitates formed were suction filtered to obtain a white solid. The white solid was dissolved by heating in 2 liters of methanol, and further 2 liters of 5% aqueous sodium carbonate solution were added, followed by stirring at 40° C. for 30 minutes. Subsequently, the dark red solution was poured into 8 liters of 5% aqueous hydrochloric acid solution to form a large amount of precipitates, which were suction filtered and dried to obtain a pale pink solid. The solid was recrystallized from a solvent mixture of ethanol and water to obtain 450 g of colorless needles of p-hydroxymethacrylanilide melting at 155° to 156° C.

An amount 53.2 g of the obtained p-hydroxymethacrylanilide (HyPMA), 15.9 g of acrylonitrile (AN), 36.5 g of methyl methacrylate (MMA), 3.5 g of ethyl acrylate (EA) and 0.82 g of α,α'-azobisisobutyronitrile were dissolved into 190 ml of a solvent mixture of acetone:ethanol (1:2), and after replacement with nitrogen gas, the mixture was heated at 65° C. to give a polymer solution. The polymer solution was poured into 3 liters of 5% aqueous HCl soluion, and the white precipitates formed were filtered and dried to obtain 70 g of a white polymer. When the molecular weight was measured, Mn was $9.5 \times 10^3$, and Mw was $2.0 \times 10^4$.

Synthesis Example 3 (Corresponding to the Above (c))

An amount 53.2 g of the p-hydroxymethacrylanilide (HyPMA) obtained in Synthesis example 2, 15.9 g of acrylonitrile (AN), 40.0 g of methyl methacrylate (MMA) and 0.82 g of α,α'-azobisisobutyronitrile were dissolved in 190 ml of a solvent mixture of acetone:ethanol (1:2), and after replacement with nitrogen gas, the mixture was heated at 65° C. to give a polymer solution. The polymer solution was poured into 3 liters of a 5% aqueous HCl solution, and the white precipitates formed were filtered and dried to obtain 70 g of a white polymer. When the molecular weight was measured, Mn was $3.2 \times 10^3$ and Mw was $2.2 \times 10^4$.

Synthesis Example 4 (Corresponding to the Above (1))

A solution of 40.0 g of p-hydroxystyrene, 20.0 g of acrylonitrile, 40 g of styrene and 1 g of α,α'-azobisisobutyronitrile dissolved in 600 ml of a solvent mixture of acetone:ethanol (1:1) was replaced with nitrogen, and then heated at 68° C. for 10 hours to give a polymer solution. The solution was poured into 5 liters of water, and the white precipitates formed were filtered and dried to obtain 70 g of a polymer. The polymer had a Mw of 47000.

Synthesis Example 5

Into a three-necked flask set in an oil bath were charged 90 g of m-cresol, 56 g of p-cresol, 54 g of phenol, 85 g of 37% aqueous formaldehyde and 2.5 g of oxalic acid, and the mixture was elevated in temperture under stirring. The mixture was foamed vigorously at around 90° C., and after once cooled temporarily, the temperature was again raised to make the inner temperature 105° C.

After the reaction for about 3 hours, further the temperature was elevated to 175° C. to remove water.

After 2 hours, the temperature was elevated to 200° C. and the pressure was reduced to 100 mmHg, and the residual monomer was evaporated. After 10 minutes, the reaction was stopped, and the reaction product was cast onto a Teflon vat to be solidified. As the result of measurement of the molecular weight of the resin, Mn was 1350, and Mw was 5400.

Synthesis Example 6

Synthesis was conducted in the same manner as in Synthesis example 5 except for changing m-cresol to 2,3-xylenol (100 g). As the result, Mn was 1400, and Mw was 4800.

Example 1

After an aluminum plate with a thickness of 0.24 mm was subjected to defatting treatment, it was subjected to electrolytic polishing treatment in an aqueous nitric acid and then to sodium hydroxide desmatting treatment. Next, the anodic oxidation treatment in an aqueous sulfuric acid and the hot water sealing treatment were effected to obtain an aluminum plate for lithographic printing plate.

Next, the aluminum plate was coated with a photosensitive solution shown below with a roll coater, followed by drying at 90° C. for 4 minutes, to obtain a sample of photosensitive lithographic printing plate.

Photosensitive Solution

| | |
|---|---|
| Condensate of trihydroxybenzophenone and naphthoquinone(1,2)-diazide-5-sulfonyl chloride | 2 parts by weight |
| Mixed cresol (phenol:m-cresol:p-cresol = 2:5:3) formalin novolac resin (weight average molecular weight = 10,000) | 8 parts by weight |
| 2-Trichloromethyl-β-(2'-benzofuryl) vinyl-1,3,4-oxadiazole | 0.06 part by weight |
| Condensate of p-octylphenol and naphthoquinone(1,2)-diazide-5-sulfonyl chlorid (condensation degree of hydroxyl group: 50 mole %) | 0.1 part by weight |
| Victoria Pure Blue BOH (manufactured by Hodogaya Kagaku K.K.) | 0.08 part by weight |
| Compound 1 of the present invention shown in Table 1 | 0.3 part by weight |
| Methyl cellosolve/ethyl cellosolve = (4/6) | 53 part by weight |

The photosensitive lithographic printing plate was evaluated for actuation by use of the film original shown below under the exposure conditions, plate preparation conditions and printing conditions shown below.

Film Original

Step tablet No. 2 (manufactured by Eastman Kodak K.K.) and original having a plurality of picture patterns plastered thereon.

Exposure Conditions

Exposure machine: metal halide lamp "Idorphin 2000" (manufactured by Iwasaki Denki K.K.) (8.0 mW/m2)
Time: 92 sec.

Developing Condition 1

Automatic developing machine: Konica PS plate automatic developing machine "PSQ-1315" (manufactured by Konica Corporation)
Developer composition:

| | |
|---|---|
| JIS No. 3 sodium silicate | 800 g |
| Potassium metasilicate | 2000 g |
| Potassium hydroxide | 300 g |
| Water | 25000 g |

Developing temperature: 25° C.
Developing time: 20 sec.
Gum solution: "SGW-1" (manufactured by Konica Corporation)

Printing Conditions

Printer: Heidel GTO
Paper pure paper
Ink: Toka Best Cure "BFWRO rouge" (manufactured by Toka Shikiso K.K.)
Wetting water: "SEU-1" diluted to 50-fold (manufactured by Konika Corporation)
Printing speed: 5000 sheets/hour

Developing Condition 2

Processing was conducted under the same conditions as in Developing condition 1 except that the fatigue solution after processing of 2.0 m² per one liter of mother liquor by developing repeatedly photosensitive lithographic printing plate subjected to the whole surface exposure was used as the developer.

Also, after a part of the photosensitive lithographic printing plate was covered with a black paper, it was placed stationarily for a certain period of time at the position 2 m below a white fluorescent light (40 W×2), and subsequently developing processing was performed under the above developing conditions 1 and 2. The time when difference between the portion covered with the black paper and the exposed portion could be distinctly observed was measured.

According to the evaluation method as described above, the clear sensitivity and the solid sensitivity, and safe light time were judged by reading from the printing plate after developing, and further the presence of ground contamination from the printed product obtained to obtain the results shown in Table 3.

Examples 2 to 8

Except for using the compounds 2 to 8 as shown in Table 1, respectively, in place of the compound 1 as shown in Example 1, photosensitive lithographic printing plates were obtained and the same experiment was conducted for each plate in the same manner as in Example 1. The results are shown in Table 3.

TABLE 1

| Compound of this invention | Structural formula | Repeating number of alkylene oxide |
|---|---|---|
| 1 | Polyoxyethylene sorbitol tetraoleate | 30 |
| 2 | Polyoxyethylene sorbitol tetrastearate | 60 |
| 3 | Polyoxyethylene sorbitol tetraoleate | 40 |
| 4 | Polyoxyethylene sorbitol hexastearate | 20 |

TABLE 1-continued

| Compound of this invention | Structural formula | Repeating number of alkylene oxide |
|---|---|---|
| 5 | Polyoxyethylene sorbitol monolaurate | 6 |
| 6 | Polyoxyethylene sorbitol monolauryl ether | 10 |
| 7 | Polyoxyethylene polyoxypropylene sorbitol tetraoleate | Oxyethylene 30 Oxypropylene 20 |
| 8 | Polyoxyethylene sorbitol tetraoleate | 110 |

Examples 9 to 13

Except for changing the amount of the compound 1 of the present invention used in Example 1 as shown below in Table 2, photosensitive lithographic printing plates were obtained in the same manner as in Example 1 and the same experiment was conducted for each plate in the same manner as in Example 1. The results are shown in Table 3.

TABLE 2

| Example No. | Added amount |
|---|---|
| 9 | 0.015 part by weight |
| 10 | 0.03 part by weight |
| 11 | 0.9 part by weight |
| 12 | 1.6 part by weight |
| 13 | 2.4 part by weight |

Comparative Example 1

Except for using Tween 80 (manufactured by Kao Atlas K.K.) <polyoxyethylene sorbitane monooleate> in place of the compound 1 of the present invention used in Example 1, a photosensitive lithographic printing plate was prepared to carry out the experiment in the same manner as in Example 1. The results are shown in Table 3.

Comparative Example 2

Except for omitting the compound 1 of the present invention from the photosensitive solution recipe in Example 1, a photosensitive lithographic printing plate was prepared to carry out the experiment in the same manner as in Example 1. The results are shown in Table 3.

Example 14

Except for using a photosensitive solution shown below in place of the photosensitive solution used in Example 1, a photosensitive lithographic printing plate was prepared to carry out the experiment in the same manner as in Example 1. The results are shown in Table 3.

Photosensitive Solution

| | |
|---|---|
| Condensate of pyrogallol-acetone resin and naphthoquinone(1,2)-diazide-5-sulfonyl chloride | 0.90 part by weight |
| Cresol-formaldehyde resin | 1.70 parts by weight |
| t-Butyl-phenol-formaldehyde resin | 0.05 part by weight |
| Naphthoquinone-1,2-diazide-4-sulfonyl chloride | 0.03 part by weight |
| Tetrahydrophthalic acid | 0.20 part by weight |
| Oil Blue #603 (manufactured by Orient Kagaku Kogyo K.K.) | 0.05 part by weight |
| Compound 1 of the present invention shown in Table 1 | 0.07 part by weight |

| | -continued | |
|---|---|---|
| Methyl cellosolve | | 15 parts by weight | lowed by drying at 90° C. for 4 minutes, to obtain a sample of photosensitive lithographic printing plate.

Photosensitive Solution

TABLE 3

| | Polyoxyalkylene comp. | | Developing condition - 1 | | | | Developing condition - 2 | | | |
|---|---|---|---|---|---|---|---|---|---|---|
| | Kind | Amount added (wt %) | Safe light time (min) | Clear stage number (stages) | Solid stage number (stages) | Contamination in printing *1 | Safe light time (min) | Clear stage number (stages) | Solid stage number (stages) | Contamination in printing *1 |
| Example 1 | Compound 1 of the invention | 2.9 | 17 | 4.5 | 11.0 | ○ | 13 | 5.5 | 12.5 | ○ |
| Example 2 | Compound 2 of the invention | 2.9 | 17 | 4.5 | 11.0 | ○ | 13 | 5.5 | 12.5 | ○ |
| Example 3 | Compound 3 of the invention | 2.9 | 18 | 4.5 | 11.0 | ○ | 14 | 5.5 | 12.5 | ○ |
| Example 4 | Compound 4 of the invention | 2.9 | 16 | 4.5 | 11.0 | ○ | 12 | 5.5 | 12.5 | ○ |
| Example 5 | Compound 5 of the invention | 2.9 | 13 | 4.5 | 11.5 | ○ | 10 | 5.5 | 13.0 | ○ |
| Example 6 | Compound 6 of the invention | 2.9 | 15 | 4.5 | 11.0 | ○ | 11 | 5.5 | 12.5 | ○ |
| Example 7 | Compound 7 of the invention | 2.9 | 16 | 4.25 | 11.0 | ○ | 12 | 5.25 | 12.5 | ○ |
| Example 8 | Compound 8 of the invention | 2.9 | 18 | 4.0 | 10.5 | ○ | 14 | 5.0 | 12.0 | Δ |
| Example 9 | Compound 1 of the invention | 0.15 | 8 | 4.5 | 12.0 | ○ | 7 | 5.75 | 13.0 | ○ |
| Example 10 | Compound 1 of the invention | 0.29 | 9 | 4.5 | 11.5 | ○ | 8 | 5.5 | 12.5 | ○ |
| Example 11 | Compound 1 of the invention | 8.1 | 18 | 4.5 | 11.0 | ○ | 14 | 5.5 | 12.5 | ○ |
| Example 12 | Compound 1 of the invention | 13.5 | 19 | 4.25 | 11.0 | ○ | 15 | 5.25 | 12.5 | ○ |
| Example 13 | Compound 1 of the invention | 19.0 | 20 | 3.75 | 10.5 | ○ | 16 | 5.0 | 12.0 | Δ |
| Example 14 | Compound 1 of the invention | 2.3 | 16 | 4.5 | 11.0 | ○ | 12 | 5.5 | 12.5 | ○ |
| Comparative example 1 | Polyoxyethylene sorbitane monooleate | 2.9 | 10 | 3.5 | 12 | ○ | 8 | 5.0 | 14.0 | X |
| Comparative example 2 | — | 0 | 5 | 5 | 13 | ○ | 2 | 6.5 | 15.5 | ○ |

*1 Contamination in printing;
○: No contamination.
Δ: Dots readily entangled.
X: Both image line portion and dot portion contaminated.

As is apparent from Table 3, it can be understood that the photosensitive lithographic printing plates of the present invention (Examples 1 to 14) are excellent in all of sensitivity, underdevelopability, developing tolerance and safe light characteristic as compared with photosensitive lithographic printing plates outside of the present invention, particularly Comparative example 1 of the conventional printing plate.

As described in detail above, according to the photosensitive lithographic printing plate of the present invention, developing tolerance and safe light characteristic can be improved without lowering sensitivity and underdevelopability.

Example 15

After an aluminum plate with a thickness of 0.24 mm was subjected to defatting treatment, it was subjected to electrolytic polishing treatment in an aqueous nitric acid and then to sodium hydroxide desmatting treatment. Next, the anodic oxidation treatment in an aqueous sulfuric acid and the hot water sealing treatment were effected to obtain an aluminum plate for lithographic printing plate.

Next, the aluminum plate was coated with a photosensitive solution shown below with a roll coater, fol-

| | |
|---|---|
| Condensate of trihydroxybenzophenone and naphthoquinone(1,2)-diazide-5-sulfonyl chloride | 2 parts by weight |
| Mixed cresol (phenol:m-cresol:p-cresol = 2:5:3) formalin novolac resin (weight average molecular weight = 10,000) | 8 parts by weight |
| 2-Trichloromethyl-β-(2'-benzofuryl)-vinyl-1,3,4-oxadiazole | 0.06 part by weight |
| Condensate of p-octylphenol and naptho-quinone(1,2)-diazide-5-sulfonyl chloride (condensation degree of hydroxyl group: 50 mole %) | 0.10 part by weight |
| Victoria Pure Blue BOH (manufactured by Hodogaya Kagaku K.K.) | 0.08 part by weight |
| Surfactant 1 of the present invention shown in Table 4 | 0.3 part by weight |
| Methyl cellosolve/ethyl cellosolve = (4/6) | 53 parts by weight |

The photosensitive lithographic printing plate thus obtained was evaluated for actuation by use of the film original shown below under the exposure conditions, plate preparation conditions and printing conditions shown below.

Film Original

Step tablet No. 2 (manufactured by Eastman Kodak K.K.), dot chart and original having a plurality of picture patterns plastered thereon.

Exposure Conditions

Exposure machine: metal halide lamp "Idorphin 2000" (manufactured by Iwasaki Denki K.K.) (8.0 mW/m2)
Time: 92 sec.

Developing Condition 3

Automatic developing machine: Konica PS plate automatic developing machine "PSQ-1315" (manufactured by Konica Corporation)

difference between the portion covered with the black paper and the exposion could be distinctly observed was measured.

On the other hand, the unexposed portion before developing was pushed with a finger, individually developed under the developing condition 4 and the degree of yield like a fingerprint was observed with eyes. The above results are shown in Table 5.

Examples 16 to 17

Except for using the surfactants 2 to 13 as shown in Table 5, respectively, in place of the surfactant 1 as shown in Example 1, photosensitive lithographic printing plates were obtained and the same experiment was conducted for each plate in the same manner as in Example 15. The results are shown in Table 5.

TABLE 4

| No. | Composition | Tradename (manufacturer) |
| --- | --- | --- |
| Activator-1 of the invention | Polyoxyethylene (20) castor oil | Nikkol CO-20TX (available from Nikko Chemicals Co.) |
| Activator-2 of the invention | Polyoxyethylene (10) castor oil | Nikkol CO-10 (available from Nikko Chemicals Co.) |
| Activator-3 of the invention | Polyoxyethylene (60) castor oil | Nikkol CO-60TX (available from Nikko Chemicals Co.) |
| Activator-4 of the invention | Polyoxyethylene (3) castor oil | Nikkol CO-3 (available from Nikko Chemicals Co.) |
| Activator-5 of the invention | Polyoxyethylene (50) hardened castor oil | Nikkol HCO-50 (available from Nikko Chemicals Co.) |
| Activator-6 of the invention | Polyoxyethylene (100) hardened castor oil | Nikkol HCO-100 (available from Nikko Chemicals Co.) |
| Activator-7 of the invention | Polyoxyethylene (20) lanolin | Nikkol TW-20 (available from Nikko Chemicals Co.) |
| Activator-8 of the invention | Polyoxyethylene (40) lanolin alcohol | Nikkol BWA-40 (available from Nikko Chemicals Co.) |
| Activator-9 of the invention | Polyoxyethylene (20) sorbitol beeswax | Nikkol GBW-125 (available from Nikko Chemicals Co.) |
| Activator-10 of the invention | Polyoxyethylene (5) phytosterol | Nikkol BPS-5 (available from Nikko Chemicals Co.) |
| Activator-11 of the invention | Polyoxyethylene (20) phytosterol | Nikkol BPS-20 (available from Nikko Chemicals Co.) |
| Activator-12 of the invention | Polyoxyethylene (25) phytostanol | Nikkol BPSH-25 (available from Nikko Chemicals Co.) |
| Activator-13 of the invention | Polyoxyethylene (20) castor oil | — |

Developer composition: Konica PS plate developer "SDR-1" diluted to 6-fold
Developing temperature: 25° C.
Developing time: 20 sec.
Gum solution: Konica PS plate Gum solution "SGW-1" (manufactured by Konica Corporation)

Developing Condition 4

The same conditions as the developing condition 3 except for using a developer having 50 ml of Konica PS plate supplemental developer "SDR-1R" added into the developer of the developing condition 3 per one liter of the developer.

Printing Conditions

Printer: Heidel GTO
Paper: pure paper
Ink: Toyo (manufactured by Toyo Ink K.K.)
Wetting water: "SEU-1" diluted to 50-fold (manufactured by Konika Corporation)
Printing speed: 5000 sheets/hour Also, after a part of the photosensitive lithographic printing plate was covered with a black paper, it was placed stationarily for a certain period of time at the position 2 m below a white fluorescent light (40 W×2), and subsequently developing processing was performed under the above developer condition 3. The time when

Example 28

Except for using a photosensitive solution shown below in place of the photosensitive solution used in Example 15, a photosensitive lithographic printing plate was prepared to carry out Example 28 in the same manner as in Example 15. The results are shown in Table 5.

| Photosensitive solution | |
| --- | --- |
| Condensate of pyrogallol-acetone resin (weight average molecular weight of 2000) and naphthoquinone(1,2)-diazide-5-sulfonyl chloride (condensation degree of hydroxyl groups 30 mole %) | 2 parts by weight |
| m-Cresol-formaldehyde resin | 0.5 part by weight |
| p-Hydroxyphenyl methacrylamide/methyl methacrylate/acrylonitrile/methacrylic acid = {36/2/40/2 (charged molar ratio)} (weight average molecular weight (Mw) = 30,000) | 8 parts by weight |
| 2-Trichloromethyl-$\beta$-(2'-benzofuryl) vinyl-1,3,4-oxadiazole | 0.06 part by weight |
| Condensate of p-octylphenol and naphthoquinone(1,2)-diazide-5-sulfonyl chloride (condensation degree of hydroxyl groups 50 mole %) | 0.20 part by weight |
| Victoria Pure Blue BOH (manufactured by Hodogaya Kagaku K.K.) | 0.08 part by weight |

-continued

| Photosensitive solution | |
|---|---|
| Surfactant 1 of the present invention shown in Table 4 | 0.3 part by weight |
| Methyl cellosolve/ethyl cellosolve = (4/6) | 53 parts by weight |

Comparative Example 3

Except for using Tween 80 (manufactured by Kao Atlas K.K.) <polyoxyethylene sorbitane monooleate> in place of the surfactant 1 of the present invention used in Example 15, Comparative example 3 was carried out in the same manner as in Example 15. The results are shown in Table 5.

TABLE 5

| No. | Activator | Developing condition - 3 | | Developing condition - 4 | | | Printing results Wiping times with plate cleaner *4 |
|---|---|---|---|---|---|---|---|
| | | Safe light time *1 (min) | Clear stage number | Safe light time (min) | Image yield at fingerprint trace *2 | Brunner small dot reproducibility *3 | |
| Example 15 | Activator 1 of the invention | 17 | 3.5 | 11 | ○ | ○ | 20 |
| Example 16 | Activator 2 of the invention | 17 | 3.5 | 12 | ○ | ○ | 20 |
| Example 17 | Activator 3 of the invention | 20 | 3.25 | 11 | ○ | ○ | 22 |
| Example 18 | Activator 4 of the invention | 15 | 3.5 | 7 | ○ | ○△ | 18 |
| Example 19 | Activator 5 of the invention | 17 | 3.5 | 11 | ○ | ○ | 20 |
| Example 20 | Activator 6 of the invention | 20 | 3.25 | 15 | ○ | ○△ | 17 |
| Example 21 | Activator 7 of the invention | 16 | 3.5 | 11 | ○ | ○ | 19 |
| Example 22 | Activator 8 of the invention | 17 | 3.5 | 11 | ○ | ○ | 19 |
| Example 23 | Activator 9 of the invention | 17 | 3.5 | 11 | ○ | ○ | 19 |
| Example 24 | Activator 10 of the invention | 18 | 3.5 | 12 | ○ | ○ | 18 |
| Example 25 | Activator 11 of the invention | 19 | 3.25 | 12 | ○ | ○ | 19 |
| Example 26 | Activator 12 of the invention | 18 | 3.25 | 12 | ○ | ○ | 19 |
| Example 27 | Activator 13 of the invention | 17 | 3.25 | 11 | ○ | ○ | 19 |
| Example 28 | Activator 1 of the invention | 17 | 3.5 | 6 | △ | △ | 16 |
| Example 29 | Activator 1 of the invention | 14 | 3.5 | 10 | ○ | ○ | 19 |
| Example 30 | Activator 1 of the invention | 17 | 3.5 | 13 | ○ | ○ | 20 |
| Example 31 | Activator 1 of the invention | 18 | 3.25 | 14 | ○ | ○ | 22 |
| Comparative example 3 | Polyoxyethylene sorbitol monooleate | 10 | 3.5 | 5 | X | X | 15 |

*1: After placed for a certain period of time at the position 2 m below white fluorescent lamp (40 W × 2), developing was carried out, and the time when the difference between the portion covered with the black paper and the exposed portion could be judged was measured.
*2: After developing, the fingerprint trace was judged by observation with eyes.
○: no yield
△: slightly yielded
X: yielded
*3: Dots of Brunner 2% dot were observed with a magnifying glass and judged by observation with eyes.
○: 100% reproduction,
○△: 80% reproduction,
△: 50% reproduction,
△X: 30% reproduction,
X: 10% or lower reproduction.
*4: For each 500 sheets' printing, ultra-plate cleaner (manufactured by ABC chemical) wiping was performed, and the number of times until the image line was yielded was shown.

Examples 29 to 31

Except for changing the amount of the surfactant 1 of the present invention added in the photosensitive solution in Example 15 to 0.02 part by weight, 0.052 part by weight and 1 part by weight, respectively, Examples 29, 30 and 31 were carried out in the same manner as in example 15, respectively. The results are shown in Table 5.

As is apparent from Table 5, it can be understood that the photosensitive lithographic printing plates of the present invention are excellent in all of resistance to invasion of the image line portion at fingerprint trace, resistance to plate cleaner, safe light characteristic and small dot reproducibility.

Examples 32 to 35, Comparative Examples 4 to 7

An aluminum plate with a thickness of 0.24 mm (material 1050, tempering H 16) was subjected to defatting treatment at 60° C. for 1 minute, and then to electrolytic etching treatment in a 0.5 molar, 1 liter aqueous hydrochloric acid under the conditions of a temperature of 25° C., a current density of 60 A/dm$^2$ and a treatment time of 30 seconds.

Then, after application of desmatting treatment in an aqueous 5% sodium hydroxide solution at 60° C. for 10 seconds, the anodic oxidation treatment was effected in a 20% aqueous sulfuric acid solution under the conditions of a temperature of 20° C., a current density of 3 A/dm$^2$ and a treatment time of 1 minute. Further, hot water sealing treatment was effected with hot water of 30° C. for 20 seconds to prepare an aluminum plate of a support for lithographic printing plate.

Preparation of Photosensitive Lithographic Printing Plate

Example 32

On the aluminum plate prepared as described above, a photosensitive composition coating solution (1) was applied by use of a rotary coater and dried at 90° C. for 4 minutes to obtain a positive-type photosensitive printing plate sample 1.

| [Composition of photosensitive composition coating solution (1)] | |
|---|---|
| Novolac resin (polymer of Synthesis example 5) | 1.5 g |
| Vinyl type polymer resin (polymer of Synthesis example 2) | 6.0 g |
| 1,2-Naphthoquinoediazide-5-sulfonic acid-2,3,4-trihydroxybenzophenone ester (QD-1) | 2.5 g |
| Activator (To-4528) | 0.2 g |
| Organic acid (terephthalic acid) | 0.1 g |
| Lipid formation sensitive agent (Esterified product product of p-t-octylphenol-formaldehyde novolac resin (Mw 1300) and 1,2-naphthoquinonediazide-5-sulfonyl chloride (condensation degree 50 mole %) | 0.1 g |
| Exposure visible picture imparting agent (2-Trichloromethyl-5-[β-(2-benzofuryl)-vinyl]1,3,4-oxadiazole) | 0.1 g |
| Dye (Victoria Pure Blue BOH, manufactured by Hodogaya Kagaku K.K.) | 0.1 g |
| Methyl cellosolve | 100 g |

Preparation of Photosensitive Lithographic Printing Plate

Examples 33 to 35 and Comparative Examples 4 to 7

Photosensitive lithographic printing plates Examples 33 to 35 and Comparative examples 4 to 7 were obtained in the same manner as in preparation of the above Example 32 except for changing the kinds and the amounts added of novolac resin, vinyl type polymer resin, o-quinoneazide compound and activator of the photosensitive composition coating solution (1) in preparation of the above photosensitive lithographic printing plate as shown in Table 6.

On the thus obtained photosensitive lithographic printing plate samples, a stab tablet for measurement of sensitivity (manufactured by Eastman Kodak Co., No. 2, 21-stage gray scale at each 0.15 density difference) was closely contacted, and exposure was effected under the condition of 8.0 mW/cm$^2$ by a 2 KW metal halide lamp (Idolphin 2000, manuractured by Iwasaki Denki) as the light source, and subsequently developed with a developer of SDR-1 (manufactured by Konica Corporation) diluted to 6-fold with water) at 27° C. for 20 seconds for examination of the exposure time when the clear step stage number is 4 on the gray scale printed on the plate after water washing.

Next, for examination of underdevelopability, the positive-type photosensitive lithographic printing plate subjected to the whole surface exposure was developed in the above developer of SDR-1 diluted to 6-fold at a ratio of 2.0 m$^2$ per one liter of developer, to make the developer fatigued, and again the positive-type photosensitive lithographic printing plate subjected to contact exposure of the positive original was developed under the same conditions as above for examination of the presence of contamination due to bad developing. Also, the state of foaming at this time was observed.

Further, for examination of resistance by overdeveloping, developing processing was effected with the above SDR-1 developer diluted to 6-fold at 30° C. for 90 seconds for examination of yield (damage) at the image portion including the small dot portion of the dots. Elevation of the solid stage number as compared with the solid step stage number in the developing processing at 27° C. for 20 seconds was determined. As the elevation of the solid stage number is smaller, better overdeveloping resistance is exhibited.

Further, for evaluation of safe light characteristic, the sample was exposed to light by leaving it to stand in light room for 10 minutes, 20 minutes and 30 minutes, developed with the developer of SDR-1 diluted with water to 6-fold (standard developer) at 25° C. for 40 seconds and compared with that not left to stand in light room for evaluation of the invasion degree at the image portion. The results are shown in Table 7.

TABLE 6

| Sample No. | Novolac resin | Amount added (g) | Vinyl polymer resin | Amount added (g) | Photosensitive material | Amount added (g) | Activator *1 | Amount added (g) |
|---|---|---|---|---|---|---|---|---|
| Example 32 | Synthesis example 5 | 1.5 | Synthesis example 2 | 6.0 | QD - 1 | 2.5 | To-4528 | 0.2 |
| Example 33 | Synthesis example 5 | 1.5 | Synthesis example 2 | 6.0 | QD - 1 | 2.5 | TA-7514 | 0.2 |
| Example 34 | Synthesis example 6 | 5.5 | Synthesis example 3 | 2.0 | QD - 2 | 2.5 | To-4529 | 0.2 |
| Example 35 | Synthesis example 6 | 5.5 | Synthesis example 3 | 2.0 | QD - 2 | 2.5 | To-4534 | 0.2 |
| Comparative example 4 | Synthesis example 5 | 1.5 | Synthesis example 2 | 6.0 | QD - 1 | 2.5 | Emulgen 108 | 0.2 |
| Comparative example 5 | Synthesis example 6 | 5.5 | Synthesis example 3 | 2.0 | QD - 2 | 2.5 | Anihitol 20N | 0.2 |
| Comparative example 6 | Synthesis example 5 | 1.5 | Synthesis example 2 | 6.0 | QD - 1 | 2.5 | — | 0 |
| Comparative | Synthesis | 5.5 | Synthesis | 2.0 | QD - 2 | 2.5 | — | 0 |

TABLE 6-continued

| Sample No. | Novolac resin Amount added (g) | Vinyl polymer resin Amount added (g) | Photosensitive material Amount added (g) | Activator *1 Amount added (g) |
|---|---|---|---|---|
| example 7 | example 6 | example 3 | | |

*1 Activator
To-4528 (available from Nippon Nyukazai K.K.) Polyoxypropylene alkyl ether
TA-7514 (available from Nippon Nyukazai K.K.) Polyoxypropylene alkylphenyl ether
To-4534 (available from Nippon Nyukazai K.K.) Polyoxypropylene alkyl ester
To-4535 (available from Nippon Nyukazai K.K.)
Emulgen 108 (available from Kao K.K.) Polyoxyethylene lauryl ether
Anihitol 20N (available from Kao K.K.) Lauryldimethylamine oxide

TABLE 7

| Sample No. | Sensitivity exposure dosage necessary to obtain clear 2 stage 4 (mJ/cm) | Underdevelopability Percentage of contamination generated in fatigued developer | Foaming of developer *2 | Overdevelopability Solid stage number difference | Damage of 150 line 5% dot | Safe light *3 characteristics Left 10 min | Left 20 min | Left 30 min |
|---|---|---|---|---|---|---|---|---|
| Example 32 | 430 | None | 3 | 4.0 | None | 5 | 5 | 4 |
| Example 33 | 450 | None | 3 | 4.5 | None | 5 | 5 | 4 |
| Example 34 | 460 | None | 3 | 4.0 | None | 5 | 5 | 4 |
| Example 35 | 450 | None | 3 | 4.0 | None | 5 | 5 | 3 |
| Comparative example 4 | 480 | None | 1 | 5.0 | None | 5 | 4 | 3 |
| Comparative example 5 | 510 | None | 1 | 5.0 | None | 4 | 3 | 2 |
| Comparative example 6 | 470 | None | 3 | 7.5 | Present | 3 | 1 | 1 |
| Comparative example 7 | 400 | None | 3 | 8.0 | Present | 3 | 2 | 1 |

*2 Foaming of developer
3: Not substantially recognized.
2: Slight foaming recognized.
1: Considerable foaming recognized.
*3 Evaluation standards for safe light characteristic
5: Substantially no invasion at image line portion recognized.
4: Invasion at image line portion slightly recognized.
3: Invasion at image line portion recognized.
2: Invasion at image line portion considerably recognized.
1: Invasion at image line portion markedly recognized.

As is apparent from Table 7, it can be understood that the photosensitive lithographic printing plates are free from foaming of the developer during developing processing and excellent in sensitivity, while maintaining safe light characteristic and developing tolerance.

As described above in detail, according to the present invention, a positive-type photosensitive lithographic printing plate excellent in sensitivity and further free from foaming of the developer when developing processing is performed without damaging safe light characteristic and developing tolerance, and a photosensitive composition suitable as the photosensitive layer of the positive-type photosensitive lithographic printing plate can be provided.

We claim:

1. A photosensitive lithographic printing plate comprising:
an aluminum plate; and
a photosensitive layer comprising in combination:
   (1) 5 to 60% by weight of an ester compound of an o-naphthoquinonediazide sulfonic acid with a polycondensed resin selected from the group consisting of a phenol-ketone resin, a phenol-aldehyde resin, a phenol-formaldehyde resin, an m-cresol-formaldehyde resin, an m- and p- mixed cresol-formaldehyde resin, a resorcin-benzaldehyde resin or a pyrogallol-acetone resin; and
   (2) 5 to 95% by weight of an alkali soluble resin selected from the group consisting of a novolac resin, a vinyl polymer resin, a phenol-formaldehyde resin, a cresol-formaldehyde resin, a phenol-cresol-formaldehyde polycondensate resin and mixtures thereof; and
   (3)
   (a) 0.2 to 20% by weight of a compound selected from the group consisting of: a polyoxyethylene sorbitol fatty acid ester compound, an ether compound of a polyoxyethylene sorbitol, a polyoxypropylene sorbitol fatty acid ester compound, an ether compound of a polyoxypropylene sorbitol, a polyoxyethylene-polyoxypropylene sorbitol fatty acid ester compound, and an ether compound of a polyoxyethylene-polyoxypropylene sorbitol,
   (b) 0.2 to 20% by weight of a compound selected from the group consisting of a polyoxyethylene adduct of castor oil, hardened castor oil, lanolin alcohol, beeswax, phytosterol and phytostanol, or
   (c) 0.05 to 10% by weight of a compound selected from the group consisting of polyoxypropylene lauryl ether, polyoxypropylene cetyl ether, polyoxypropylene stearyl ether, polyoxypropylene oleyl ether, polyoxypropylene octylphenyl ether, polyoxypropylene nonylphenyl ether, polyoxypropylene oleylphenyl ether, polyoxypropylene lauryl ester, polyoxypropylene cetyl ester, and polyoxypropylene stearyl ester.

2. A photosensitive lithographic printing plate according to claim 1, wherein said polyoxyethylene sorbitol fatty acid ester compound is polyoxyethylene sorbitol hexastearate, polyoxyethylene sorbitol tetrastearate, polyoxyethylene sorbitol tetraoleate, polyoxyethylene sorbitol hexaoleate, polyoxyethylene sorbitol monooleate, polyoxyethylene sorbitol monolaurate, polyoxyethylene sorbitol tetralaurate, polyoxyethylene sorbitol hexalaurate, polyoxypropylene sorbitol hexastearate, polyoxypropylene sorbitol tetraoleate, polyoxypropylene sorbitol hexaoleate, polyoxypropylene sorbitol monolaurate, polyoxyethylene-polyoxypropylene sorbitol hexastearate, polyoxyethylene-polyoxypropylene sorbitol tetrastearate, polyoxyethylene-polyoxypropylene sorbitol monooleate, or polyoxyethylene-polyoxypropylene sorbitol tetraoleate.

3. A photosensitive lithographic printing plate according to claim 1, wherein said ether compound of polyoxyethylene sorbitol is polyoxyethylene sorbitol hexastearyl ether, polyoxyethylene sorbitol tetrastearyl ether, polyoxyethylene sorbitol tetraoleyl ether, polyoxyethylene sorbitol monolauryl ether or polyoxyethylene sorbitol monooleyl ether.

4. A photosensitive lithographic printing plate according to claim 1, wherein said photosensitive layer contains 10–50% by weight of said sulfonic acid ester compound.

5. A photosensitive lithographic printing plate according to claim 1, wherein said photosensitive layer contains 20–90% by weight of an alkali soluble phenol-formaldehyde resin, cresol-formaldehyde resin or phenol-cresol-formaldehyde copolycondensate resin.

* * * * *